(12) United States Patent
Biswas et al.

(10) Patent No.: US 10,852,335 B2
(45) Date of Patent: Dec. 1, 2020

(54) ESTIMATION OF ELECTRICAL GRID PARAMETERS

(71) Applicant: General Electric Technology GmbH, Baden (CH)

(72) Inventors: Saugata Swapan Biswas, Redmond, WA (US); Srinivas Musunuri, Redmond, WA (US); Siddharth Likhate, Redmond, WA (US); Weiguo Wang, Redmond, WA (US)

(73) Assignee: GENERAL ELECTRIC TECHNOLOGY GmbH, Baden (CH)

( * ) Notice: Subject to any disclaimer, the term of this patent is extended or adjusted under 35 U.S.C. 154(b) by 373 days.

(21) Appl. No.: 15/901,610

(22) Filed: Feb. 21, 2018

(65) Prior Publication Data
US 2019/0257867 A1    Aug. 22, 2019

(51) Int. Cl.

| | |
|---|---|
| *G06F 11/30* | (2006.01) |
| *G01R 27/16* | (2006.01) |
| *G01R 31/08* | (2020.01) |
| *G01C 9/00* | (2006.01) |
| *G01R 19/25* | (2006.01) |
| *H02J 3/00* | (2006.01) |

(52) U.S. Cl.
CPC .............. *G01R 27/16* (2013.01); *G01C 9/00* (2013.01); *G01R 19/2513* (2013.01); *G01R 31/08* (2013.01); *H02J 3/00* (2013.01); *H02J 2203/20* (2020.01)

(58) Field of Classification Search
CPC .................................................... G01R 27/16
See application file for complete search history.

(56) References Cited

U.S. PATENT DOCUMENTS

2008/0204054 A1    8/2008   Wells

OTHER PUBLICATIONS

Yan Du Et al.:"Online estimation of power transmission line parameters, temperature and sag", North American Power Symposium (NAPS), 2011, IEEE, Aug. 4, 2011 pp. 1-6 (Year: 2011).*

European Search Report dated Jun. 24, 2019 which was filed in connection with EP19156702.3 which was filed on Feb. 12, 2019.

(Continued)

*Primary Examiner* — Phuong Huynh
(74) *Attorney, Agent, or Firm* — Buckley, Maschoff & Talwalkar LLC (57) ABSTRACT

This disclosure relates to systems and methods for estimation of electrical grid parameters. An example system may include a data acquisition module configured to acquire electrical parameters. The electrical parameters can be measured at electrical components of the electrical grid. The electrical components may include at least one transmission line and at least one transformer. The system may include a parameter estimation module configured to analyze the electrical parameters to estimate impedance parameters associated with the electrical components and provide, via a user interface, at least one indication regarding the impedance parameters. The system may further include a line sagging detection module configured to estimate, based on the impedance parameters, at least one line sagging parameter indicative of sagging of the transmission line. The line sagging detection module can be further configured to output at least one indication regarding the sagging of the at least one transmission line.

16 Claims, 5 Drawing Sheets

(56) References Cited

OTHER PUBLICATIONS

Yan Du Et Al.: "Online estimation of power transmission line parameters, temperature and sag", North American Power Symposium (NAPS), 2011, IEEE, Aug. 4, 2011 pp. 1-6.

Dejager F A Et. Al.: On-line performance monitoring of a transmission line using synchrophasor measurements, 2015 IEEE Endhoven Powertech, IEEE, Jun. 29, 2015 pp. 1-5.

Oleinikova Irina Et. Al.: PMU measurements application for transmission line temperature and sag estimation algorithm development, 2014 55th International Scientific Conference on Power and Eletrical Engineering of RIGA Technical University, IEEE, Oct. 14, 2014 pp. 181-185.

Poorani Ramachandran Et. Al.: "On-Line Monitoring of Sag in Overhead Transmission Lines with Leveled Spans", Power Symposium, 2006 NAPS 2016 38th North American , IEEE, PI, Sep. 1, 2006 pp. 405-409.

* cited by examiner

Acquire, by a data acquisition module, electrical parameters, wherein the electrical parameters are measured at components, the components including at least one transmission line and at least one transformer
302

Analyze, by a parameter estimation module, the electrical parameters to estimate impedance parameters associated with the components
304

Providing, via a user interface, at least one indication regarding the impedance parameters
306

ESTIMATION OF ELECTRICAL GRID PARAMETERS

TECHNICAL FIELD

The disclosure relates to monitoring electrical grids, and, more specifically, to systems and methods for estimation of electrical grid parameters.

BACKGROUND

The results of analysis in the applications in an energy management system (EMS) depend on accuracy of impedance parameters of branches of electrical grids, such as transmission lines and transformers. Typically, the analysis in the applications is based on an assumption that parameters of the branches have been modeled correctly and do not change over time. However, this assumption may not be valid, which may lead to errors in the parameters of the branches. If the parameters of the branches are modeled incorrectly, the solution quality of the applications of the EMS that use the parameters as inputs can be affected.

In addition, conductor temperature variations (due to ambient temperature variations and/or change in loading levels) may play a role in changing the parameters of the branches from their model values. For example, such variations may lead to excessive line sagging and interfere with operation of electrical grids in a proximity of unmaintained (untrimmed) vegetation and, potentially, lead to cascaded outages causing a blackout.

Traditionally, sagging of transmission lines has been determined based on mechanical parameters such as weight, tension and span length of the transmission line between transmission towers. However, the mechanical parameters may be measured at the span level of individual transmission lines, and hence may be challenging in terms of scaling. Additionally, details of the mechanical parameters required for determining of sagging of transmission lines may not be available for all the required transmission lines in electrical grids.

SUMMARY OF THE DISCLOSURE

This disclosure relates to systems and methods for electrical grid monitoring. Certain embodiments of the disclosure can provide for estimation of electrical grid parameters. Certain embodiments of the disclosure can provide for monitoring and diagnostics of electrical grid components, such as transmission lines and transformers. Some embodiments of the disclosure may facilitate early predictions of failures of electrical grid equipment.

According to one embodiment of the disclosure, a system for estimation of electrical grid parameters is provided. The system may include a data acquisition module configured to acquire electrical parameters. The electrical parameters can be measured at electrical components of the electrical grid. The electrical components may include at least one transmission line and at least one transformer. The system may further include a parameter estimation module configured to analyze the electrical parameters to estimate impedance parameters associated with the electrical components. The parameter estimation module can be further configured to provide, via a user interface, at least one indication regarding the impedance parameters.

In some embodiments of the disclosure, the system may further include a line sagging detection module configured to estimate, based on the impedance parameters, at least one line sagging parameter indicative of sagging of the at least one transmission line. The line sagging detection module can be further configured to output, via the user interface and based on the at least one sagging parameter, at least one indication regarding the sagging of the at least one transmission line.

In some embodiments of the disclosure, the at least one line sagging parameter may include a ratio of a change in length of the at least one transmission line to a change in distance of the at least one transmission line to ground.

In some embodiments of the disclosure, the line sagging detection module can be further configured to calculate a deviation of the at least one sagging parameter from a reference sagging parameter and output another indication depicting the deviation via a graphical display interface.

In certain embodiments of the disclosure, the line sagging detection module can be further configured to compute correlation coefficients between the at least one sagging parameter and the impedance parameters based on historical values for the at least one sagging parameter and historical values for the impedance parameters obtained during a user-determined time window. The line sagging detection module can be further configured to determine a probability of the sagging of the at least one line based on the correlation coefficients and the deviation.

In some embodiments of the disclosure, the parameter estimation module can be further configured to scan through multi-timepoint data snapshots at various levels and perform estimation of the branch impedance parameters in a hierarchical manner. Such hierarchical levels of estimation can include at least one of the following: a short-term estimation level, a long-term estimation level, and a historical-estimation level. The parameter estimation module can be further configured to determine the at least one line sagging parameter based on the long-term estimates.

In some embodiments of the disclosure, the electrical parameters may include a voltage and a power flow measured at the ends of the at least one transmission line. The impedance parameters may include a resistance, a reactance, and a susceptance of the at least one transmission line.

In some embodiments of the disclosure, the electrical parameters may further include a voltage and a power flow measured at an input of the at least one transformer. The impedance parameters may include a resistance and reactance of the at least one transformer.

According to another embodiment of the disclosure, a method for estimation of electrical grid parameters is provided. The method may include acquiring, by a data acquisition module, electrical parameters. The electrical parameters can be measured at electrical components of the electrical grid. The electrical components may include at least one transmission line and at least one transformer. The method may further include analyzing, by a parameter estimation module, the electrical parameters to estimate impedance parameters associated with the electrical components. The method may further allow providing, via a user interface, at least one indication regarding the impedance parameters.

The method may further include estimating, by a line sagging detection module and based on the impedance parameters, at least one line sagging parameter indicative of sagging of the at least one transmission line. The method may further include outputting, by the line sagging detection module and based on the at least one sagging parameter, at least one indication regarding the sagging of the at least one transmission line.

Other embodiments, systems, methods, features, and aspects will become apparent from the following description taken in conjunction with the following drawings.

DETAILED DESCRIPTION

The following detailed description includes references to the accompanying drawings, which form part of the detailed description. The drawings depict illustrations, in accordance with example embodiments. These example embodiments, which are also referred to herein as "examples," are described in enough detail to enable those skilled in the art to practice the present subject matter. The example embodiments may be combined, other embodiments may be utilized, or structural, logical, and electrical changes may be made, without departing from the scope of the claimed subject matter. The following detailed description is, therefore, not to be taken in a limiting sense, and the scope is defined by the appended claims and their equivalents.

Certain embodiments of the disclosure can include systems and methods for estimation of electrical grid parameters. Certain embodiments of the disclosure can provide procedures for monitoring and diagnostics of electrical grid components, such as transmission lines and transformers. Some embodiments of the disclosure may facilitate early predictions of failures of electrical grid equipment.

Some embodiments of the disclosure may provide real-time monitoring parameters of branches of the electrical grids and detecting line sagging of transmission lines in real-time. The parameters of the branches can be estimated based on the real-time measurements available from supervisory control and data acquisition (SCADA) system and/or phasor measurements unit(s) (PMU(s)). The parameters of the branches can be further used to detect sagging of transmission lines. Some embodiments of the disclosure may provide detection of a discrepancy in the modeled parameters due to modeling errors and track real-time changes in the parameters of the transmission lines due to a variation of a conductor temperature, and, thereby, detect sagging of transmission lines in real-time.

In some example embodiments of the disclosure, a method for estimation of electrical grid parameters may include acquiring, by a data acquisition module, electrical parameters. The electrical parameters can be measured at electrical components. The electrical components can include at least one transmission line and at least one transformer. The method may further include analyzing, by a parameter estimation module, the electrical parameters to estimate impedance parameters associated with the electrical components. The method may further allow providing, via a user interface, at least one indication regarding the impedance parameters. The method may further include estimating, by a line sagging detection module and based on the impedance parameters, at least one line sagging parameter indicative of sagging of the at least one transmission line. The method may further include outputting, by the line sagging detection module and based on the at least one sagging parameter, at least one indication regarding the sagging of the at least one transmission line.

Technical effects of certain embodiments of the disclosure may include eliminating a manual process for monitoring and diagnostic of electrical grid equipment and provide an early detection of issues in the electrical grid network. Further technical effects of certain embodiments of the disclosure may provide online insight into important components of electrical grid equipment components to improve reliability of the components and reduce maintenance costs. Yet further technical effects of certain embodiments of the disclosure may allow reducing unplanned shutdowns, forced outage time, and unplanned expenses.

The following provides a detailed description of various example embodiments related to systems and methods for estimation of electrical grid parameters.

Figure 1:
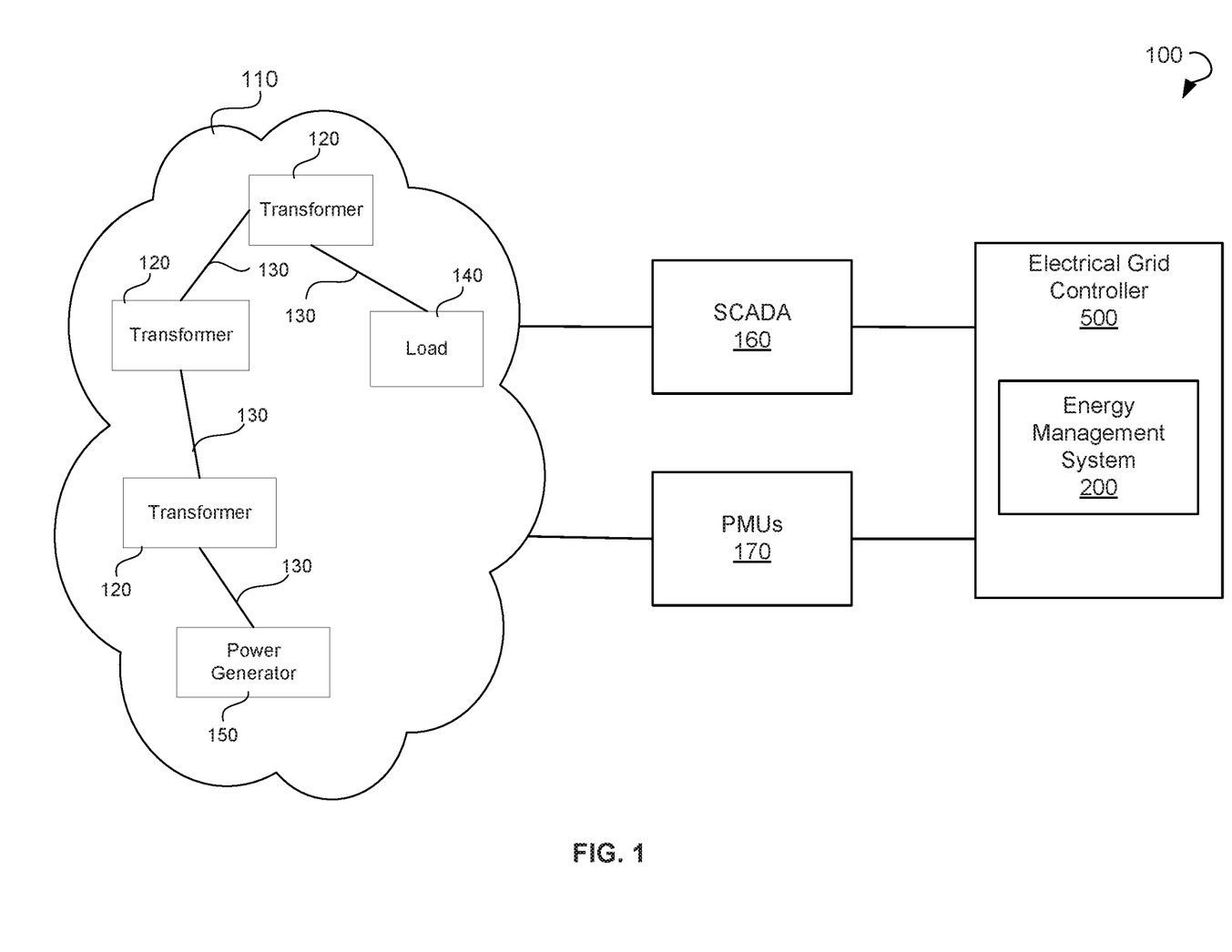
FIG. 1 is a block diagram illustrating an example environment in which methods for estimation of electrical grid parameters can be implemented, according to some embodiments of the disclosure.

Turning now to the drawings, FIG. 1 is a block diagram illustrating a system 100, wherein the method for estimation of electrical grid components can be implemented in accordance with an example embodiment of the disclosure. In some embodiments, the system 100 may include an electrical grid 110. The electrical grid 110 may include one or more components (also referred to as branches) including transformer(s) 120, one or more transmission line(s) 130, one or more load(s) 140, and one or more power generator(s) 150.

In some embodiments of the disclosure, the system 100 may further include one or more PMU(s) 170. The PMU(s) 170 may include power meters and voltage meters. The electrical grid 110 may further include actuators, protective relays, circuit breakers, and so forth. In some embodiments of the disclosure, the PMU(s) 170 may be configured to measure electrical parameters related at least to the transmission line(s) 120 and transformer(s) 130. The electrical parameters may include voltage and power flow measured at ends of the branches of the electrical grid 110.

In some embodiments, the system 100 may include a SCADA system 160 operable to collect the electrical parameters measured at the ends of the branches of electrical grid 110. The SCADA system 160 may also provide management of the electrical grid 110.

The system 100 may further include an electrical grid controller 500. The electrical grid controller 500 may include an energy management system (EMS) 200. In various embodiments, the EMS 200 can be implemented as instructions stored in a memory to be executed by one or more processors of the electrical grid controller. The EMS 200 can be configured to receive electrical parameters measured at the ends of transformer(s) 120 and transmission line(s) 130. The electrical parameters can be received directly from PMU(s) 170 and/or SCADA system 160.

Figure 2:
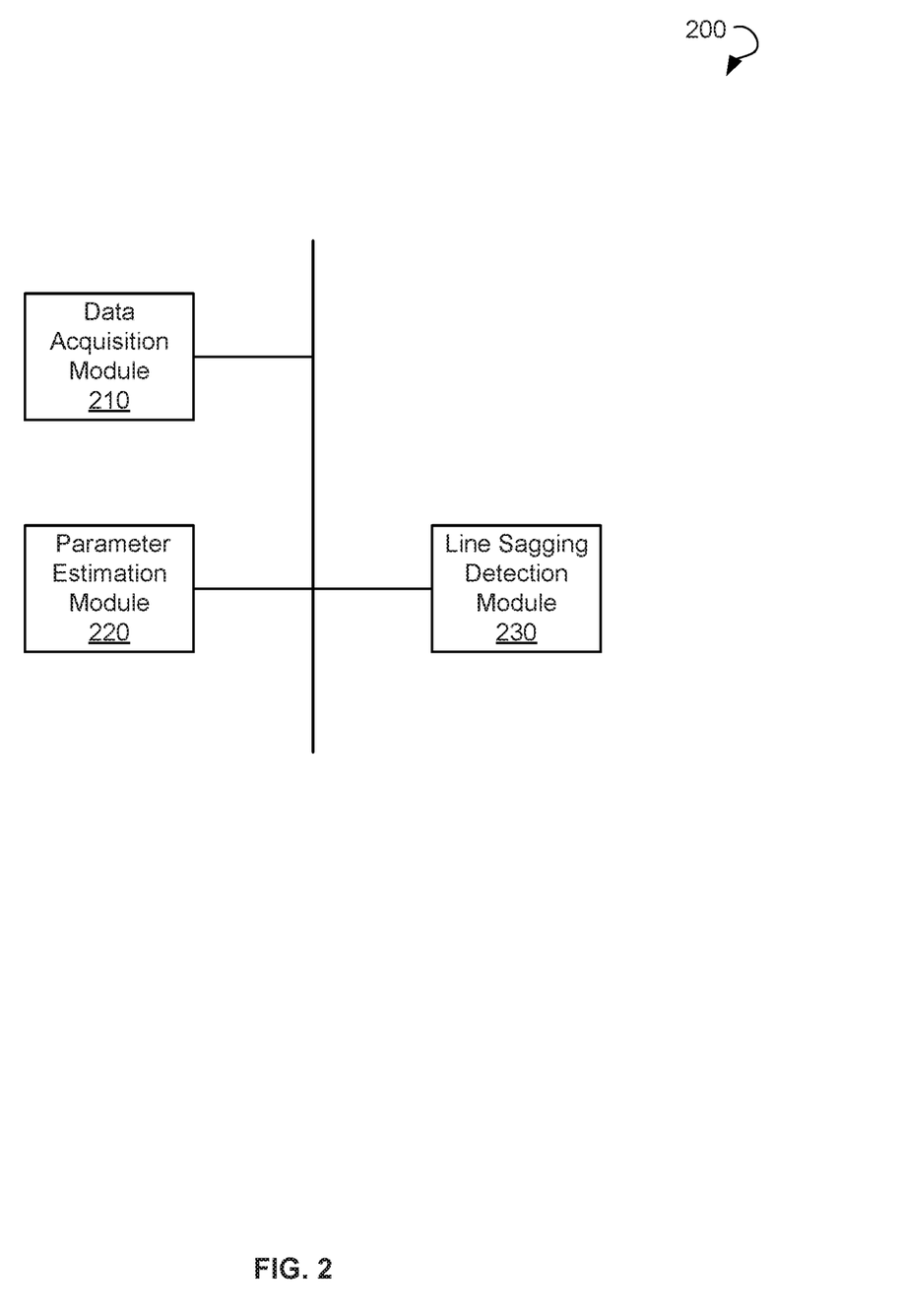
FIG. 2 is a block diagram showing an example energy management system, according to some embodiments of the disclosure.

FIG. 2 is a block diagram illustrating the example EMS 200, according to some embodiments of the disclosure. The EMS 200 may include a data acquisition module 210, a parameter estimation module 220, and a line sagging detection module 230.

In some embodiments of the disclosure, the data acquisition module 210 can be configured to receive electrical parameters measured at the ends of the branches of the electrical grid 110. The electrical parameters can be collected at multiple timepoints via, for example, PMU(s) 170. For example, the electrical parameters can be collected periodically according to a pre-determined schedule.

In some embodiments of the disclosure, the parameter estimation module 220 can be configured to perform a state estimation of the impedance parameters of the branches of the electrical grid 110 using a weighted least squares approach. The impedance parameters (resistance, reactance, and susceptance for transmission lines and resistance and reactance for transformers) may form a state variable vector, and the electrical parameters (voltage, current, and power flow) across multiple timepoints may form a multi-timepoint measurement vector for the estimation formulation. The estimation can be performed at each individual branch of the electrical grid 110.

In some embodiments of the disclosure, if the electrical parameters measurements are available at both ends of a branch, these electrical parameters can be used as inputs for the estimation. In certain embodiments, the input may also include pseudo-measurements for electrical parameters for initialization purposes in a multi-timepoint based estimation. The pseudo-measurements can be computed based at least on the last valid state estimator solution.

In some embodiments of the disclosure, if measurements of the electrical parameters are not available at least for one end of a branch, the parameter estimation module 220 can be configured to compute pseudo-measurements for these electrical parameters based on the last valid state estimator solution. The pseudo-measurements can be further included in the input for the estimation to increase the number of branches for which the impedance parameters can be estimated.

In some embodiments of the disclosure, the measured electrical parameters and pseudo-measurements can be used to form the multi-timepoint measurement vector. Each of the measured electrical parameters and pseudo-measurements can be used to add a relationship as a function of one or more state variables in the estimation formulation. In certain embodiments, each of the relationship can be assigned a weight and a cost. The cost may include a function of the weight and the square of a residue. The state estimation problem can be further solved to minimize the sum of the individual costs of all the relationships. Upon completion of the state estimation, an internal error processing can be carried for the estimated branch impedance parameters. The estimates impedance parameters can be flagged, for example, as "good" or "bad". This procedure may complete a first level of estimation of the impedance parameters in real time.

In some embodiments of the disclosure, the parameter estimation module 220 can be further configured, to scan through multi-timepoint data snapshots at various levels and perform estimation of the branch impedance parameters in a hierarchical manner including, but not limited to, a short-term estimation level, a long-term estimation level, and a historical-estimation level. For example, the parameter estimation module 220 can be further configured, upon completion of the first level of multi-timepoint short-term estimation of impedance parameters, to perform a second level of a multi-timepoint estimation. The second level may include a moving window filtering of the short-term estimates flagged as "good" across multiple timepoints to obtain a long-term impedance parameter estimates. In certain embodiments, an additional third level of filtering can be performed using the historical multi-timepoint long-term estimates archived over long time periods. Performing several hierarchical levels of multi-time point based parameter estimation may increase the robustness and accuracy of the parameter estimator solution.

In some embodiments of the disclosure, the line sagging detection module 230 can be configured to use the impedance parameters of transmission lines (resistance, reactance, and susceptance) to estimate sagging of one or more of the transmission line(s) 130. The module line sagging detection module 230 can be configured to calculate a line sag margin (LSM) and multiple time-point based impedance correlation coefficients. In some embodiments of the disclosure, the LSM can be a quantitative indication of an extent of sagging of a transmission line 130. The LSM can be computed based on the latest single snapshot of the long-term transmission line impedance parameter estimates and model values corresponding to impedance parameter estimates. The model values of the impedance parameters may serve as references for computing deviations of the estimated impedance parameters.

The line sagging detection module 230 can be configured to determine whether the deviations are within a user-defined threshold. When a transmission line is sagging, the length of the transmission line increases and distance from the transmission line to the ground decreasing. The sagging of the transmission line is directly proportional to the length of transmission line and is inversely proportional to the distance to the ground. The LSM can be computed based on the ratio of the transmission line length and the distance to ground. In turn, the transmission line length and the distance to the ground can be computed based on the estimated impedances of the transmission line and corresponding model values (or reference impedances). In some embodiments, the line sagging detection module 230 can be configured to display the LSM via a user interface on a scale of 0 to 100, wherein a lower value of the LSM would indicate a lesser margin for sagging due to the possibility of increased sagging.

In some embodiments of the disclosure, the line sagging detection module 230 can be configured to perform an additional analysis to confirm that the transmission line is sagging. The analysis may be needed since the LSM depends on reference impedance parameters. If a transmission line tends to sag, the resistance, reactance, and susceptance tend to correlate to length of the transmission line and distance from the transmission line to the ground. A statistical method can be applied over a window of historically obtained impedance parameter estimates across multiple time-points to detect the trend in parameter variations. When the parameter estimation module 220 estimates a long-term set of impedance parameters, the LSM can be further computed using the latest impedance parameter estimates. If the LSM is less than a user-defined threshold, then the line sagging detection module 230 can be configured to perform line impedance correlation analysis for transmission line impedance parameters (resistance, reactance, and susceptance) and LSM using the latest impedance parameter estimates within a data window. The length of the data window can be user-configurable.

In certain embodiments of the disclosure, the results of the correlation analysis can be displayed via a user interface in the form of correlation coefficients on a scale of 0 to ±1, where correlation coefficients closer to ±1 are indicative of a relatively strong correlation. The statistical correlation analysis in addition to the computation of the LSM can confirm that the transmission line is sagging.

In some embodiments of the disclosure the line sagging detection module 230 can be further configured to determine a possibility of sagging of one or more transmission line(s) based on LSM and the correlation coefficients. The possibility can be displayed via a user interface, for example, as 'High', or 'Medium', or 'Low'.

Figure 3:
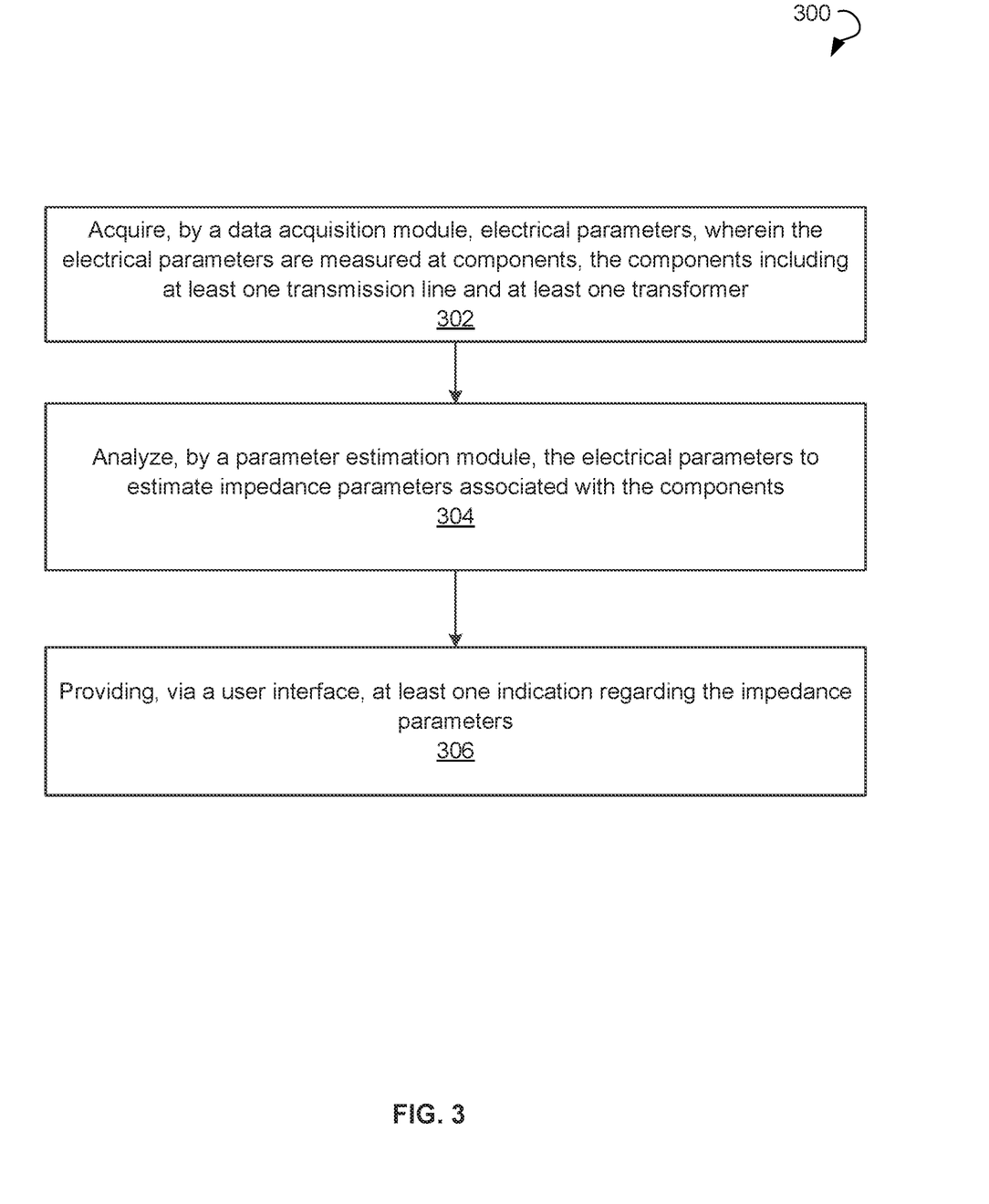
FIG. 3 is a flow chart illustrating an example method for estimation of electrical grid parameters, according to some embodiments of the disclosure.

FIG. 3 is a flow chart illustrating an example method 300 for estimation of electrical grid parameters, according to some embodiments of the disclosure. The method 300 can be implemented by system 200 described above with reference to FIG. 2 and FIG. 1.

In block 302, the method 300 may commence with acquiring, by a data acquisition module, electrical parameters. The electrical parameters can be measured at components of the electrical grid. The components may include at least one transmission line and at least one transformer. In block 304, the method 300 may analyze, by a parameter estimation module, the electrical parameters to estimate impedance parameters associated with the components. In block 306, the method 300 may provide, via a user interface, at least one indication concerning the impedance parameters.

Figure 4:
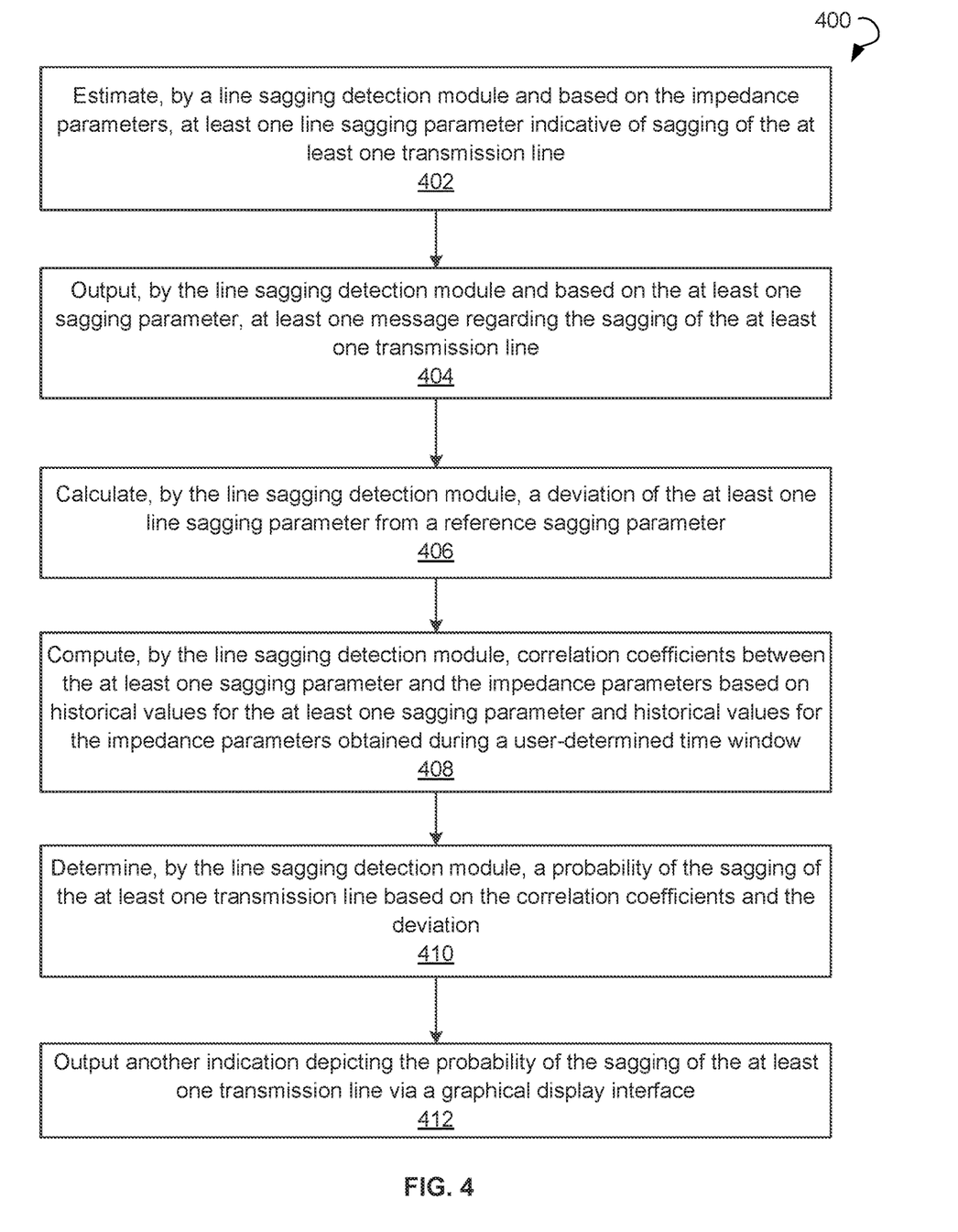
FIG. 4 is a flow chart illustrating an example method for estimation of transmission line sagging, according to some embodiments of the disclosure.

FIG. 4 is a flow chart illustrating an example method 400 for estimation of transmission line sagging, according to some example embodiments of the disclosure. The method 400 can continue from the method 300 depicted in FIG. 3. In block 402, the method 400 may estimate, by a line sagging detection module and based on the impedance parameters, at least one line sagging parameter indicative of sagging of the at least one transmission line. In block 404, the method 400 may output, by the line sagging detection module and based on the at least one sagging parameter, at least one message concerning the sagging of the at least one transmission line.

In block 406, the method 400 may continue with calculating, by the line sagging detection module, a deviation of the at least one line sagging parameter from a reference sagging parameter. In block 408, the method 400 may compute, by the line sagging detection module, correlation coefficients between the at least one sagging parameter and the impedance parameters based on historical values for the at least one sagging parameter and historical values for the impedance parameters obtained during a user-determined time window. In block 410, the method 400 may determine, by the line sagging detection module, a probability of the sagging of the at least one transmission line based on the correlation coefficients and the deviation of the sagging parameter. In block 412, the method 400 may output another indication depicting the probability of the sagging of the at least one transmission line via a graphical display interface.

Figure 5:
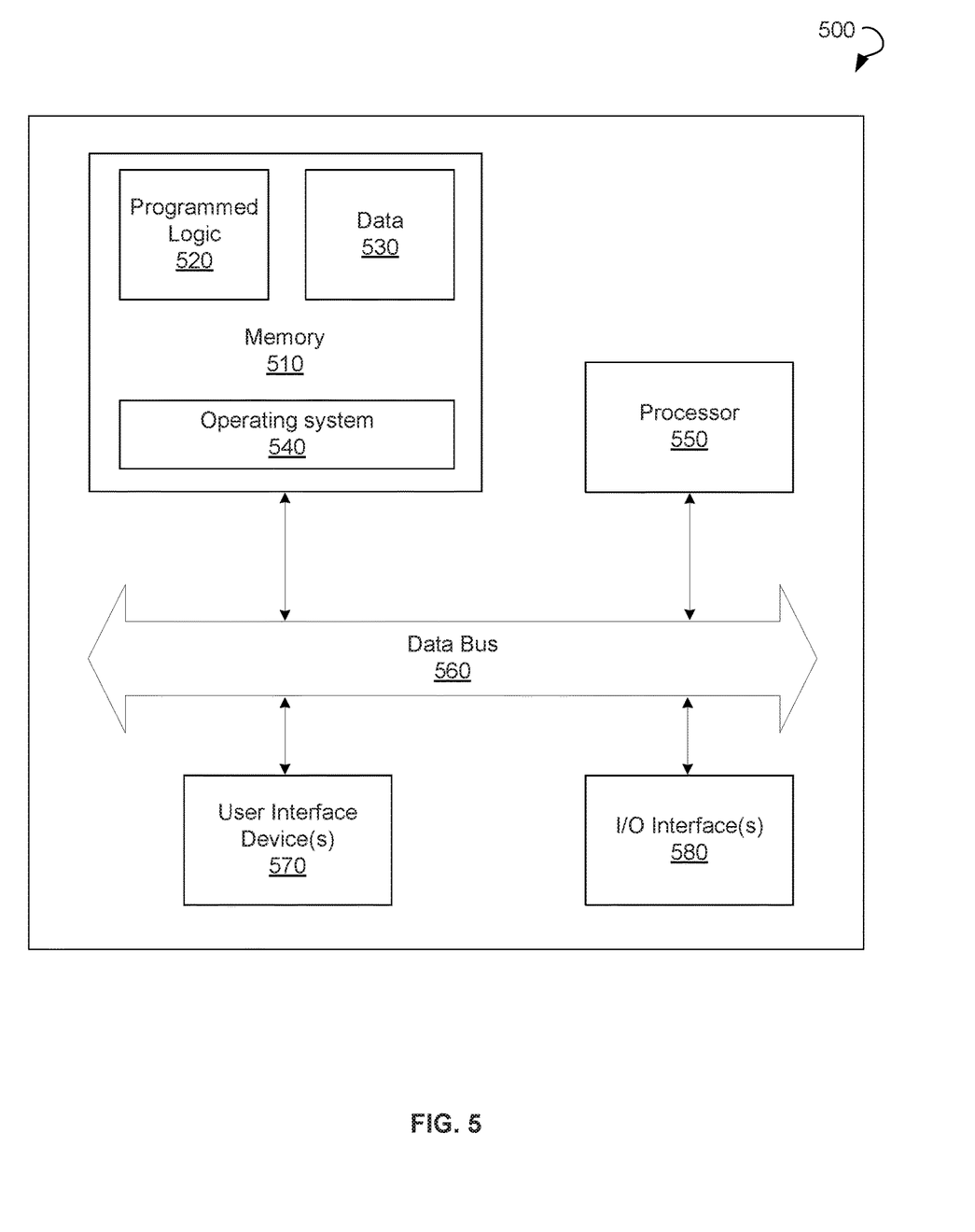
FIG. 5 is a block diagram illustrating an example controller for estimation of electrical grid parameters, in accordance with some embodiments of the disclosure.

FIG. 5 depicts a block diagram illustrating an example electrical grid controller 500, in accordance with an embodiment of the disclosure. More specifically, the elements of the electrical grid controller 500 may be used to analyze electrical parameters measured from electrical grid components. The electrical grid controller 500 may include a memory 510 that stores programmed logic 520 (e.g., software) and may store data 530, such as operational data associated with the system 100, the set of constants, and the like. The memory 510 also may include an operating system 540.

A processor 550 may utilize the operating system 540 to execute the programmed logic 520, and in doing so, may also utilize the data 530. A data bus 560 may provide communication between the memory 510 and the processor 550. Users may interface with the electrical grid controller 500 via at least one user interface device 570, such as a keyboard, mouse, control panel, or any other device capable of communicating data to and from the electrical grid controller 500. The electrical grid controller 500 may be in communication with other elements of the system 100 while operating via an input/output (I/O) interface 580. Additionally, it should be appreciated that other external devices or multiple other systems may be in communication with the electrical grid controller 500 via the I/O interface 580. In some embodiments of the disclosure, the electrical grid controller 500 may be located remotely with respect to the other elements of the system 100; however, in other embodiments of the disclosure, it may be co-located or even integrated with the system 100. Further, the electrical grid controller 500 and the programmed logic 520 implemented thereby may include software, hardware, firmware, or any combination thereof. It should also be appreciated that multiple electrical grid controllers 500 may be used, whereby different features described herein may be executed on one or more different electrical grid controllers 500.

References are made to block diagrams of systems, methods, apparatuses, and computer program products, according to example embodiments of the disclosure. It will be understood that at least some of the blocks of the block diagrams, and combinations of blocks in the block diagrams, may be implemented at least partially by computer program instructions. These computer program instructions may be loaded onto a general purpose computer, special purpose computer, special purpose hardware-based computer, or other programmable data processing apparatus to produce a machine, such that the instructions which execute on the computer or other programmable data processing apparatus create means for implementing the functionality of at least some of the blocks of the block diagrams, or combinations of blocks in the block diagrams discussed.

These computer program instructions may also be stored in a computer-readable memory that can direct a computer or other programmable data processing apparatus to function in a particular manner, such that the instructions stored in the computer-readable memory produce an article of manufacture including instruction means that implement the function specified in the block or blocks. The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the block or blocks.

One or more components of the systems and one or more elements of the methods described herein may be implemented through an application program running on an operating system of a computer. They also may be practiced with other computer system configurations, including handheld devices, multiprocessor systems, microprocessor based or programmable consumer electronics, mini-computers, mainframe computers, and the like.

Application programs that are components of the systems and methods described herein may include routines, programs, components, data structures, and so forth that implement certain abstract data types and perform certain tasks or actions. In a distributed computing environment, the application program (in whole or in part) may be located in local memory or in other storage. In addition, or alternatively, the application program (in whole or in part) may be located in remote memory or in storage to allow for circumstances where tasks are performed by remote processing devices linked through a communications network.

Many modifications and other embodiments of the example descriptions set forth herein to which these descriptions pertain will come to mind having the benefit of the teachings presented in the foregoing descriptions and the associated drawings. Thus, it will be appreciated that the disclosure may be embodied in many forms and should not be limited to the example embodiments described above.

Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A system for monitoring parameters of an electrical grid, the system comprising:
   a data acquisition module configured to acquire electrical parameters, wherein the electrical parameters are measured at electrical components of the electrical grid, the electrical components including at least one transmission line and at least one transformer; and
   a parameter estimation module configured to:
   analyze the electrical parameters to estimate impedance parameters associated with the electrical components;
   provide, via a user interface, at least one indication regarding the impedance parameters;
   a line sagging detection module configured to:
   estimate, based on the impedance parameters, at least one line sagging parameter indicative of sagging of the at least one transmission line;
   output, via the user interface and based on the at least one sagging parameter, at least one indication regarding the sagging of the at least one transmission line;
   the line sagging detection module is further configured to:
   calculate a deviation of the at least one sagging parameter from a reference sagging parameter; and
   output another indication depicting the deviation via a graphical display interface.

2. The system of claim 1, wherein the at least one line sagging parameter includes a ratio of a change in a length of the at least one transmission line to a change in a distance of the at least one transmission line to a ground.

3. The system of claim 1, wherein the line sagging detection module is further configured to compute correlation coefficients between the at least one sagging parameter and the impedance parameters based on historical values for the at least one sagging parameter and historical values for the impedance parameters obtained during a user-determined time window.

4. The system of claim 3, wherein the line sagging detection module is further configured to determine a probability of the sagging of the at least one line based on the correlation coefficients and the deviation.

5. The system of claim 1, wherein the parameter estimation module is further configured to:
   scan through multi-timepoint data snapshots at various levels and perform estimation of the branch impedance parameters in a hierarchical manner; and
   determine the at least one sagging parameter based on the results of the hierarchical levels of estimation.

6. The system of claim 5, wherein the hierarchical levels of estimation include at least one of the following: a short-term estimation level, a long-term estimation level, and a historical-estimation level.

7. The system of claim 1, wherein:
   the electrical parameters include a voltage and a power flow measured at the ends of the at least one transmission line; and
   the impedance parameters include a resistance, a reactance, and a susceptance of the at least one transmission line.

8. The system of claim 1, wherein:
   the electrical parameters include a voltage and a power flow measured at an input and an output of the at least one transformer; and
   the impedance parameters include a resistance and a reactance of the at least one transformer.

9. A method for monitoring parameters of an electrical grid, the method comprising:
   acquiring, by a data acquisition module, electrical parameters, wherein the electrical parameters are measured at electrical components, the electrical components including at least one transmission line and at least one transformer;
   analyzing, by a parameter estimation module, the electrical parameters to estimate impedance parameters associated with the electrical components;
   providing, via a user interface, at least one indication regarding the impedance parameters;
   estimating, by a line sagging detection module and based on the impedance parameters, at least one line sagging parameter indicative of a sagging of the at least one transmission line;
   outputting, by the line sagging detection module and based on the at least one sagging parameter, at least one indication concerning the sagging of the at least one transmission line;
   calculating, by the line sagging detection module, a deviation of the at least one line sagging parameter from a reference sagging parameter; and
   outputting another indication depicting the deviation via a graphical display interface.

10. The method of claim 9, wherein the at least one line sagging parameter includes a ratio of a change in a length of the at least one transmission line to a change in a distance of the at least one transmission line to a ground.

11. The method of claim 9, further comprising computing, by the line sagging detection module, correlation coefficients between the at least one sagging parameter and the impedance parameters based on historical values for the at least one sagging parameter and historical values for the impedance parameters obtained during a user-determined time window.

12. The method of claim 11, further comprising determining, by the line sagging detection module, a probability of the sagging of the at least one line based on the correlation coefficients and the deviation.

13. The method of claim 9, further comprising:
   scanning through multi-timepoint data snapshots at various levels and performing estimation of the branch impedance parameters in a hierarchical manner including at least one of: a short-term estimation level, a long-term estimation level, and a historical-estimation level; and
   determining, by the parameter estimation module, the at least one sagging parameter based on the results of the hierarchical levels of estimation.

14. The method of claim 9, wherein:
   the impedance parameters include a resistance, a reactance, and a susceptance of the at least one transmission line; and
   the electrical parameters include a voltage and a power flow measured at the ends of the at least one transmission line.

15. The method of claim 9, wherein:
the electrical parameters include a voltage and a power flow measured at an input and an output of the at least one transformer; and
the impedance parameters include a resistance and a reactance of the at least one transformer.

16. A system for monitoring parameters of electrical grid, the system comprising:
a data acquisition module configured to acquire electrical parameters, wherein the electrical parameters are measured at electrical components, the electrical components including at least one transmission line and at least one transformer, wherein the electrical parameters include at least:
voltages and a power flow measured at the ends of the at least one transmission line; and
voltages and a power flow measured at an input and an output of the at least one transformer;
a parameter estimation module configured to:
analyze the electrical parameters to estimate impedance parameters associated with the electrical components, wherein the impedance parameters include:
a resistance, a reactance, and a susceptance of the at least one transmission line;
a resistance and a reactance of the at least one transformer; and
provide, via a user interface, at least one indication regarding the impedance parameters; and
a line sagging detection module configured to:
estimate, based on the impedance parameters, at least one line sagging parameter indicative of sagging of the at least one transmission line, wherein the at least one line sagging parameter includes a ratio of a change in a length of the at least one transmission line to a change in a distance of the at least one transmission line to a ground;
calculate a deviation of the at least one sagging parameter from a reference sagging parameter;
compute correlation coefficients between the at least one sagging parameter and the impedance parameters based on historical values for the at least one sagging parameter and historical values for the impedance parameters obtained during a user-determined time window;
determine a probability of the sagging of the at least one line based on the correlation coefficients and the deviation; and
output, based on the at least one sagging parameter, at least one indication regarding the probability of the sagging of the at least one transmission line.

* * * * *